(12) United States Patent
Fujisawa

(10) Patent No.: US 7,719,922 B2
(45) Date of Patent: *May 18, 2010

(54) ADDRESS COUNTER, SEMICONDUCTOR MEMORY DEVICE HAVING THE SAME, AND DATA PROCESSING SYSTEM

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 34 days.

This patent is subject to a terminal disclaimer.

(21) Appl. No.: 12/167,779

(22) Filed: Jul. 3, 2008

(65) Prior Publication Data

US 2009/0010091 A1    Jan. 8, 2009

(30) Foreign Application Priority Data

Jul. 4, 2007    (JP) .............................. 2007-175844

(51) Int. Cl.
*G11C 8/00* (2006.01)
(52) U.S. Cl. .................. 365/236; 365/219; 365/233.11
(58) Field of Classification Search .................. 365/236, 365/233.1, 230.08, 219, 233.11
See application file for complete search history.

(56) References Cited

U.S. PATENT DOCUMENTS

| | | | |
|---|---|---|---|
| 6,856,270 B1 * | 2/2005 | Farmer et al. ............... | 341/161 |
| 6,914,829 B2 * | 7/2005 | Lee ......................... | 365/189.02 |
| 7,107,384 B1 * | 9/2006 | Chen et al. .................. | 710/309 |
| 2009/0010092 A1 * | 1/2009 | Fujisawa ..................... | 365/236 |

FOREIGN PATENT DOCUMENTS

JP    2007-102936 A    4/2007

OTHER PUBLICATIONS

"A 1.2Gb/s/pin Double Data Rate SDRAM with On-Die-Termination", by Ho Young Song and 15 others, ISSCC 2003/Session 17/SRAM and DRAM/Paper 17.8 (U.S.A), IEEE, 2003, p. 314.

* cited by examiner

*Primary Examiner*—Richard Elms
*Assistant Examiner*—Hien N Nguyen
(74) *Attorney, Agent, or Firm*—Sughrue Mion, PLLC

(57) ABSTRACT

An address counter includes FIFO units and first to third command counters that controls the groups. In the FIFO units, latch circuits including input gates and output gates are connected in parallel. The first command counter conducts any one of the input gates in response to a first internal command; the second command counter conducts any one of the output gates in response to a second internal command; and the third command counter conducts any one of the output gates in response to a third internal command. Thereby, the same address signals can be outputted successively at a plurality of timings, and thus, a circuit scale of the address counter can be reduced.

10 Claims, 10 Drawing Sheets

ADDRESS COUNTER, SEMICONDUCTOR MEMORY DEVICE HAVING THE SAME, AND DATA PROCESSING SYSTEM

TECHNICAL FIELD

The present invention relates to an address counter and a semiconductor memory device having the same, and, more particularly relates to an address counter using a point-shift FIFO circuit and a semiconductor memory device having the same. The present invention also relates to a data processing system including such a semiconductor memory device.

BACKGROUND OF THE INVENTION

Synchronous memory devices represented by synchronous DRAM (Dynamic Random Access Memory) have been widely used for a main memory or the like of a personal computer. The synchronous memory device can input and output data in synchronism with a clock signal supplied from a memory controller. Therefore, when a higher-speed clock is used, a data transfer rate can be increased.

However, so long as a DRAM core performs an analog operation also in the synchronous DRAM, a considerably weak charge needs to be amplified based on a sense operation. Accordingly, it is not possible to shorten a time from issuing a read command until outputting first data. After a lapse of a predetermined delay time since an issuance of the read command, the first data is outputted in synchronism with an external clock.

This delay time during a read operation is generally called a "CAS latency" and is set to an integral multiple of a clock cycle. For example, when the CAS latency is 5 (CL=5), the synchronous memory device fetches the read command in synchronism with the external clock, and thereafter, outputs the first data in synchronism with the external clock after five clock cycles. That is, the first data is outputted after a lapse of the five clock cycles.

Such delay is required also during a write operation. During the write operation, the data needs to be continuously inputted in synchronism with the external clock after a lapse of a predetermined delay time after an issuance of a write command. This delay time during the write operation is generally called a "CAS write latency" and is set to an integral multiple of a clock cycle. For example, when the CAS write latency is 5 (CWL=5), the synchronous memory device fetches the write command in synchronism with the external clock, and thereafter, needs to input the first data in synchronism with the external clock after five clock cycles.

The write data thus fetched is written via a read/write bus, a column switch or the like into a memory cell employed inside the memory device. Thus, it is necessary that an address signal is appropriately delayed also inside the memory device to supply the address signal to each circuit at an appropriate timing. Because of these purposes, an FIFO circuit that delays the address signal by a predetermined period is used in the synchronous memory device. Such a FIFO circuit is generally called an "address counter".

The most simple method for delaying the address signal is to use a shift-register FIFO circuit. However, when this method is used, there is a problem in that since the number of required stages of shift registers is proportional to the latency. Therefore, when the latency becomes larger, a size of a circuit scale is automatically increased. Since the latency is tended to become larger with a higher frequency of a clock, it is not possible to avoid an increase of latency caused concurrently with a high speed of the synchronous memory device.

For an FIFO circuit smaller in circuit scale than that of the shift register type, there have been types of a point-shift FIFO circuit described in Japanese Patent Application Laid-open No. 2007-102936 and in "A 1.2 Gb/s/pin Double Data Rate SDRAM with On-Die-Termination", by Ho Young Song and 15 others, ISSCC 2003/SESSION 17/SRAM AND DRAM/PAPER 17.8, (U.S.A), IEEE, 2003, p. 314. The point-shift FIFO circuit is an FIFO circuit which has a configuration in which a plurality of latch circuits having input gates and output gates are connected in parallel. The point-shift FIFO circuit can set an output timing of a latched signal by being brought any one of the input gates and any one of the output gates into on state.

The number of latch circuits required for the point-shift FIFO circuit is not equal to that of the latencies, but is defined according to a maximum accumulation number of an address signal to be delayed. Thus, the circuit scale can be further reduced than a case that the shift register is used.

As described above, in the synchronous memory device, timings for supplying addresses to the respective internal circuits differ. Thus, when the address counter is configured by using the point-shift FIFO circuit, it becomes necessary to prepare a plurality of sets of FIFO units inside the point-shift FIFO circuit.

More specifically, because write data inputted via a data input/output terminal is supplied from the data input/output circuit via the column switch or the like to the memory cell, supplying the address signal basically needs to be performed according to this order. Thus, it becomes necessary to separately prepare a FIFO unit that supply the address signal to the data input/output circuit and a FIFO unit that supply the address signal to the column switch.

In addition, as described above, the number of latch circuits required for one set of the FIFO unit is defined by a maximum accumulation number of address signal, and thus, when a minimum input cycle (tCCD) of a command is small, the circuit scale becomes large as a result, and this poses a problem.

SUMMARY OF THE INVENTION

The present invention has been achieved to solve the above problems, and an object of the present invention is to provide an improved address counter using a point-shift FIFO circuit.

Another object of the present invention is to provide an address counter using a point-shift FIFO circuit, the address counter capable of reducing a circuit scale.

Still another object of the present invention is to provide a semiconductor memory device having such an address counter.

Still another object of the present invention is to provide a data processing system having such a semiconductor memory device.

An address counter according to the present invention comprises:

a plurality of FIFO units each of which stores a corresponding bit of an address signal, each FIFO unit including a plurality of parallel connected latch circuits each having an input gate and first and second output gates;

a first command counter that brings any one of the input gates included in each FIFO unit into ON state in response to a first internal command;

a second command counter that brings any one of the first output gates included in each FIFO unit into ON state in response to a second internal command; and a third command counter that brings any one of the second output gates included in each FIFO unit into ON state in response to a third internal command.

A semiconductor memory device according to the present invention, comprises:

a memory cell array;

a data input/output terminal;

a first data selection circuit that supplies a first data bus with write data inputted via the data input/output terminal;

a second data selection circuit that supplies the memory cell array with the write data on the first data bus; and the address counter having above mentioned configuration, wherein the address signal that passes through the first output gate is supplied to the first data selection circuit, and the address signal that passes through the second output gate is supplied to the second data selection circuit.

A data processing system according to the present invention includes the semiconductor memory device having above mentioned configuration.

It is preferable that the semiconductor memory device according to the present invention further comprises a mode register for setting a burst length, wherein the first data selection circuit includes:

a FIFO block connected to the data input/output terminal;

a transfer circuit that inputs and outputs in parallel k-bit data continuously inputted or continuously outputted via the data input/output terminal; and a second data bus that performs data transfer between the transfer circuit and the FIFO block, wherein when a minimum burst length settable to the mode register is represented by j (<k), the transfer circuit performs data transfer using the second data bus in a j-bit unit irrespective of the burst length.

It is more preferable that the memory cell array is divided into a plurality of groups, and the semiconductor memory device further comprises main amplifiers each of which outputs the k-bit data from a corresponding group of the memory cell array, and wherein the transfer circuit selects j-bit data for each group out of the k-bit data outputted from the main amplifiers and supplies the selected j-bit data via the second data bus to the FIFO block.

It is more preferable that when the burst length set to the mode register is k, the transfer circuit successively supplies via the second data bus to the FIFO block the k-bit data read from the memory cell array belonging to a same group by each j bits. On the other hand, when the burst length set to the mode register is j, the transfer circuit successively supplies via the second data bus to the FIFO block the j-bit data read from the memory cell array belonging to a different group.

Thus, the address counter according to the present invention has a configuration of a point-shift FIFO circuit, and each latch circuit has a plurality of output systems. Accordingly, even when there is necessity of successively outputting the same address signal at a plurality of timings, there is no need of preparing a plurality of sets of FIFO units per bit. Thus, it becomes possible to reduce a circuit scale of the address counter.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
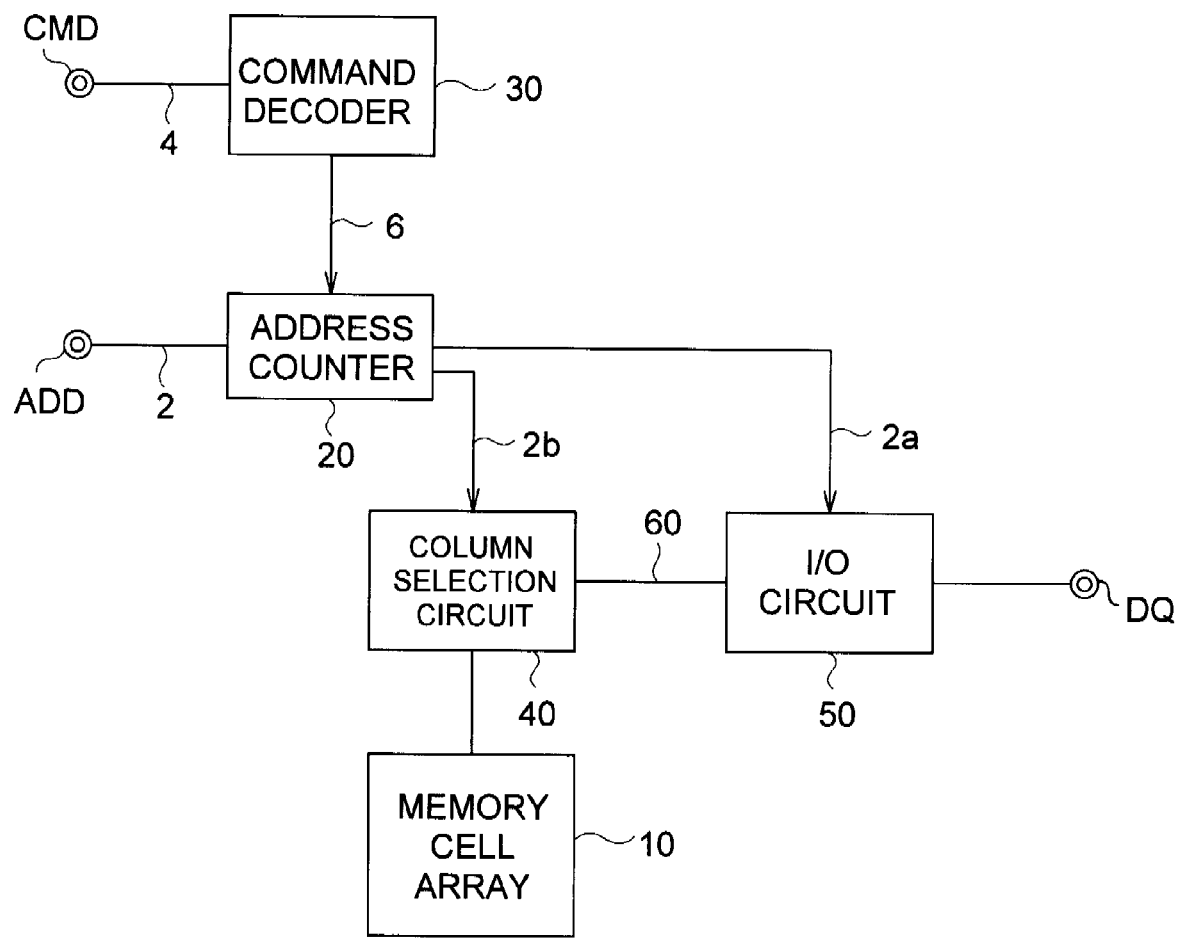
FIG. 1 is a block diagram showing a configuration of a main part of a semiconductor memory device according to a first embodiment of the present invention.

FIG. 1 is a block diagram showing a configuration of a main part of a semiconductor memory device according to the first embodiment of the present invention. In FIG. 1, only column system circuits and data system circuits are shown because they are characteristic parts of the semiconductor memory device of the present embodiment. A row system circuits or the like are therefore omitted.

As shown in FIG. 1, the semiconductor memory device includes: a memory cell array 10; and external terminals such as a data input/output terminal DQ, an address terminal ADD, and a command terminal CMD. In a case of performing a write operation, a write command is issued via the command terminal CMD, and a desired address signal is inputted via the address terminal ADD. After a lapse of a predetermined latency, write data is supplied to the data input/output terminal DQ.

An address signal (column address) 2 inputted via the address terminal ADD is fetched into an address counter 20, and a command signal 4 inputted via the command terminal CMD is decoded by a command decoder 30. An internal command 6 that is generated by the command decoder 30 is supplied to the address counter 20, and thereby, an operation of the address counter 20 is controlled. The address signal 2 fetched into the address counter 20 is supplied to a column selection circuit 40 and an I/O circuit 50 at a predetermined timing under the control of the command decoder 30.

The I/O circuit 50 is a circuit that supplies the write data inputted via the data input/output terminal DQ to a data bus 60. The I/O circuit 50 works as a "first data selection circuit" in the present invention. Although not shown, in the I/O circuit 50, besides an input buffer and an output buffer, a circuit that performs serial-to-parallel conversion of burst-inputted write data or the like is included.

Further, the column selection circuit 40 is a circuit that supplies the memory cell array 10 with the write data on the data bus 60. The column selection circuit 40 works as a "second data selection circuit" in the present invention.

Although not shown, the column selection circuit 40 includes a column switch, a column decoder or the like.

Figure 2:
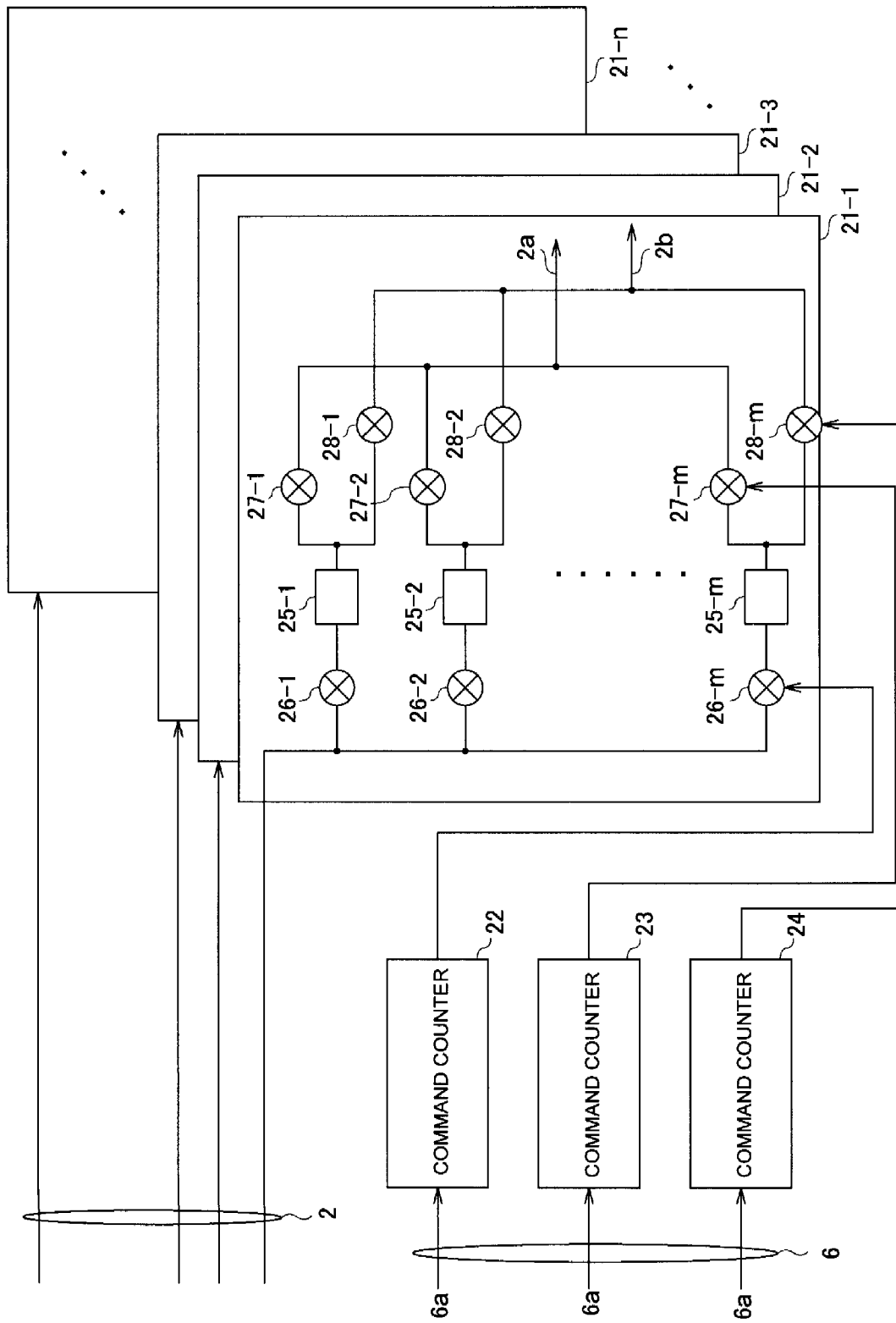
FIG. 2 is a circuit diagram of an address counter shown in FIG. 1.

FIG. 2 is a circuit diagram of the address counter 20.

As shown in FIG. 2, the address counter 20 has a configuration of a point-shift FIFO circuit, and includes a plurality of FIFO units 21-1 to 21-n, and command counters 22 to 24 each of which controls the FIFO units 21-1 to 21-n.

The FIFO units 21-1 to 21-n can hold corresponding one bit of the address signal 2, respectively. Accordingly, the number (on) of FIFO units is equal to the number of bits of the address signal 2 to be latched. On the other hand, the command counters 22 to 24 are arranged commonly to the plurality of FIFO units 21-1 to 21-n. Accordingly, control by the command counters 22 to 24 is performed commonly to the plurality of FIFO units 21-1 to 21-n.

As shown in FIG. 2, the FIFO units 21-1 to 21-n have a configuration in which a plurality of latch circuits 25-1 to 25-m are connected in parallel. The latch circuits 25-1 to 25-m are connected with input gates 26-1 to 26-m, first output gates 27-1 to 27-m, and second output gates 28-1 to 28-m, respectively. The number (=m) of latch circuits included in one FIFO unit is set according to a maximum accumulation number of the address signal 2.

In a case of a DDR (double data rate) synchronous DRAM, a maximum accumulation number m of the address signal 2 is defined as m=1+{AL+CWL+(BL/2)+2}/tCCd, where AL denotes an additive latency; CWL denotes a CAS write latency; BL denotes a burst length; and tCCD denotes a minimum input cycle of a command. As one example, AL=10; CWL=8; BL=8; and tCCD=4, m=6 is established. Accordingly, when the number (=n) of bits of the address signal 2 is 16 bits, for example, 96 (=6×16) latch circuits are needed.

The command counters 22 to 24 perform a count operation in response to corresponding internal commands 6a to 6c, respectively, out of an internal command 6.

The internal command 6a is an internal command generated in response to issuance of a read command or a write command. On the other hand, the internal commands 6b and 6c are internal command generated with a predetermined latency to the internal command 6a. The latency of the internal command 6b is determined based on an address supply timing to the I/O circuit 50 shown in FIG. 1, and the latency of the internal command 6c is determined based on an address supply timing to the column selection circuit 40 shown in FIG. 1.

Figure 3:
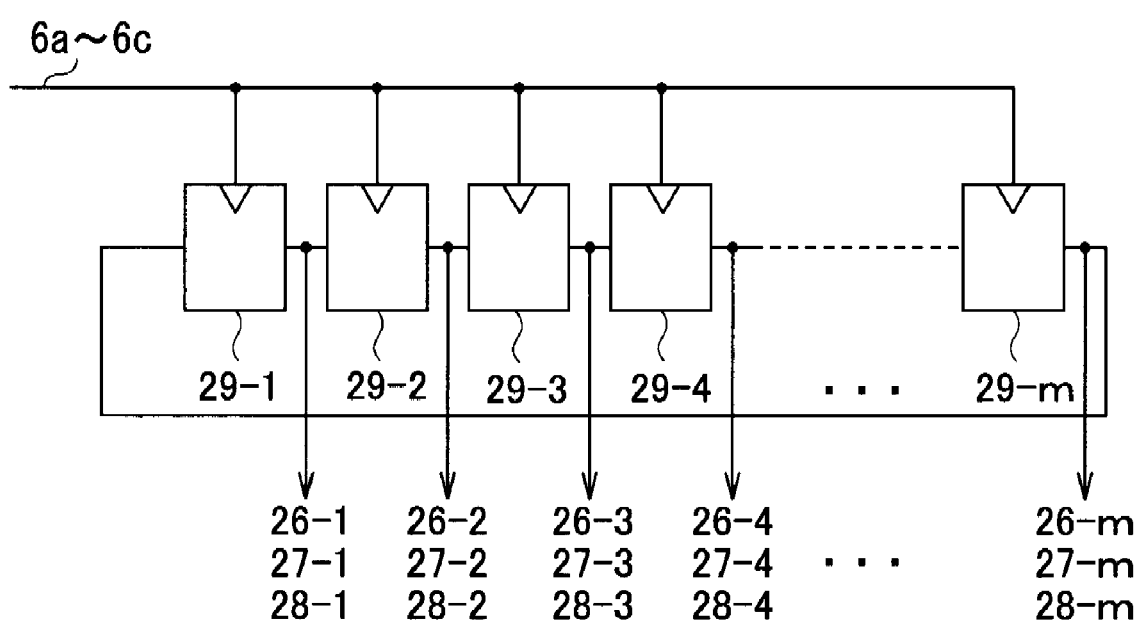
FIG. 3 is a circuit diagram of command counters shown in FIG. 2.

FIG. 3 is a circuit diagram of the command counters 22 to 24.

As shown in FIG. 3, the command counters 22 to 24 each have a ring counter configuration in which shift registers 29-1 to 29-m are connected in circulation. The internal command 6a is commonly supplied to the shift registers 29-1 to 29-m configuring the command counter 22; the internal command 6b is commonly supplied to the shift registers 29-1 to 29-m configuring the command counter 23; and the internal command 6c is commonly supplied to the shift registers 29-1 to 29-m configuring the command counter 24.

The number (=m) of shift registers 29-1 to 29-m connected in circulation is equal to the number of latch circuits included in one FIFO unit. Outputs of the respective shift registers are supplied to the corresponding input gates or output gates. Specifically, the outputs of the shift registers 29-1 to 29-m included in the command counter 22 are supplied to the input gates 26-1 to 26-m, respectively; outputs of the shift registers 29-1 to 29-m included in the command counter 23 are supplied to the first output gates 27-1 to 27-m, respectively; and outputs of the shift registers 29-1 to 29-m included in the command counter 24 are supplied to the second output gates 28-1 to 28-m, respectively. As described above, the control of the FIFO units 21-1 to 21-n by the command counters 22 to 24 is common.

In the shift registers 29-1 to 29-m, an active level (high level, for example) is latched to any one of the shift registers, and inactive levels (low levels, for example) are latched to the other shift registers. Accordingly, the command counter 22 brings any one of the input gates 26-1 to 26-m included in the respective FIFO units 21-1 to 21-n into ON state; the command counter 23 brings any one of the first output gates 27-1 to 27-m included in the respective FIFO units 21-1 to 21-n into ON state; and the command counter 24 brings any one of the second output gates 28-1 to 28-m included in the respective FIFO units 21-1 to 21-n into ON state. When the internal commands 6a to 6c are supplied, positions of the shift registers which latch the active level are moved within the command counters 22 to 24, and thus, the selected input gates or the output gates are switched.

The address signal 2a which passes through the first output gates 27-1 to 27-m is supplied to the I/O circuit 50, and the address signal 2b which passes through the second output gate 28-1 to 28-m is supplied to the column selection circuit 40. The address signal 2a needed by the I/O circuit 50 is usually only a part of the bit of the inputted address signal 2. Accordingly, in the FIFO units corresponding to the bits not used in the I/O circuit 50, the first output gates 27-1 to 27-m can be omitted.

An operation of the address counter 20 is explained next.

Figure 4:
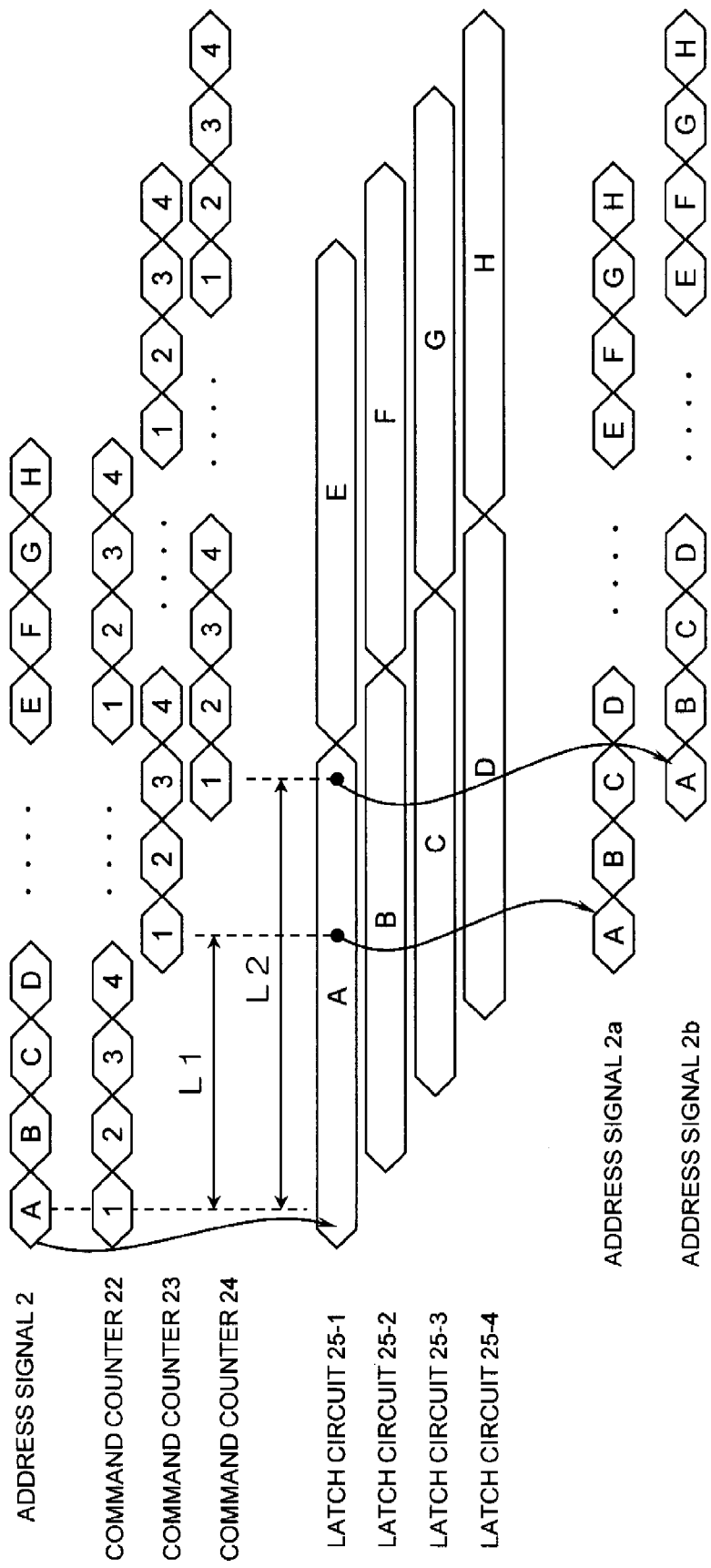
FIG. 4 is a timing chart for explaining an operation of the address counter shown in FIG. 1.

FIG. 4 is a timing chart for explaining the operation of the address counter 20.

In an example shown in FIG. 4, in sequence with a change of the address signal 2 inputted to the address counter 20, a count value of the command counter 22 changes as 1, 2, 3, 4, .... The count value of the command counter 22 corresponds to each branch number of the input gates 26-1 to 26-m, and thus, the input gates 26-1, 26-2, 26-3, 26-4, ... are successively conducted. As a result, each value of A, B, C, D, ... of the address signal 2 is latched successively to the latch circuits 25-1, 25-2, 25-3, 25-4, .... The latched address is kept until the count value of the command counter 22 becomes the same value again.

On the other hand, also count values of the command counters 23 and 24 change as 1, 2, 3, 4, ..., with a predetermined latency. In the example shown in FIG. 4, a latency of the internal command 6b to the internal command 6a is L1, and accordingly, since the command counter 22 shows a predetermined count value, the command counter 23 shows the count value after a lapse of an L1 time. Similarly, a latency of the internal command 6c to the internal command 6a is L2, and accordingly, the command counter 24 shows the count value after a lapse of an L2 time since the command counter 22 shows a predetermined count value.

Thus, the address signal 2 latched to the latch circuits 25-1, 25-2, 25-3, 25-4, ... is outputted as the address signal 2a after a lapse of the L1 time since being latched, and further, outputted as the address signal 2b after a lapse of the L2 time since being latched. That is, the address signal can be outputted at a plurality of timings by one set of the FIFO units per bit without arranging a plurality of sets of FIFO units per bit. This is a result of focusing a point that the latched address is kept until the count value of the command counter 22 becomes the same value again.

Thus, according to the present embodiment, the respective latch circuits configuring the FIFO units 21-1 to 21-n have a plurality of output systems, and thus, the same address signal can be outputted successively at a plurality of timings.

Thereby, the address counter 20 can be miniaturized, and thus, a chip size of the semiconductor memory device can be reduced. Further, resulting from a decrease in number of latch circuits, a consumed power is reduced and a load of the address signal 2 is reduced as well, and thus, a high-speed access can be also achieved.

Further, the output timings of the address signal in the respective output systems can be set arbitrarily, and thus, it is possible to be compatible with a so-called OTF (On The Fly) function, i.e., dynamically switching a burst length.

A second embodiment of the present invention is explained next.

Figure 5:
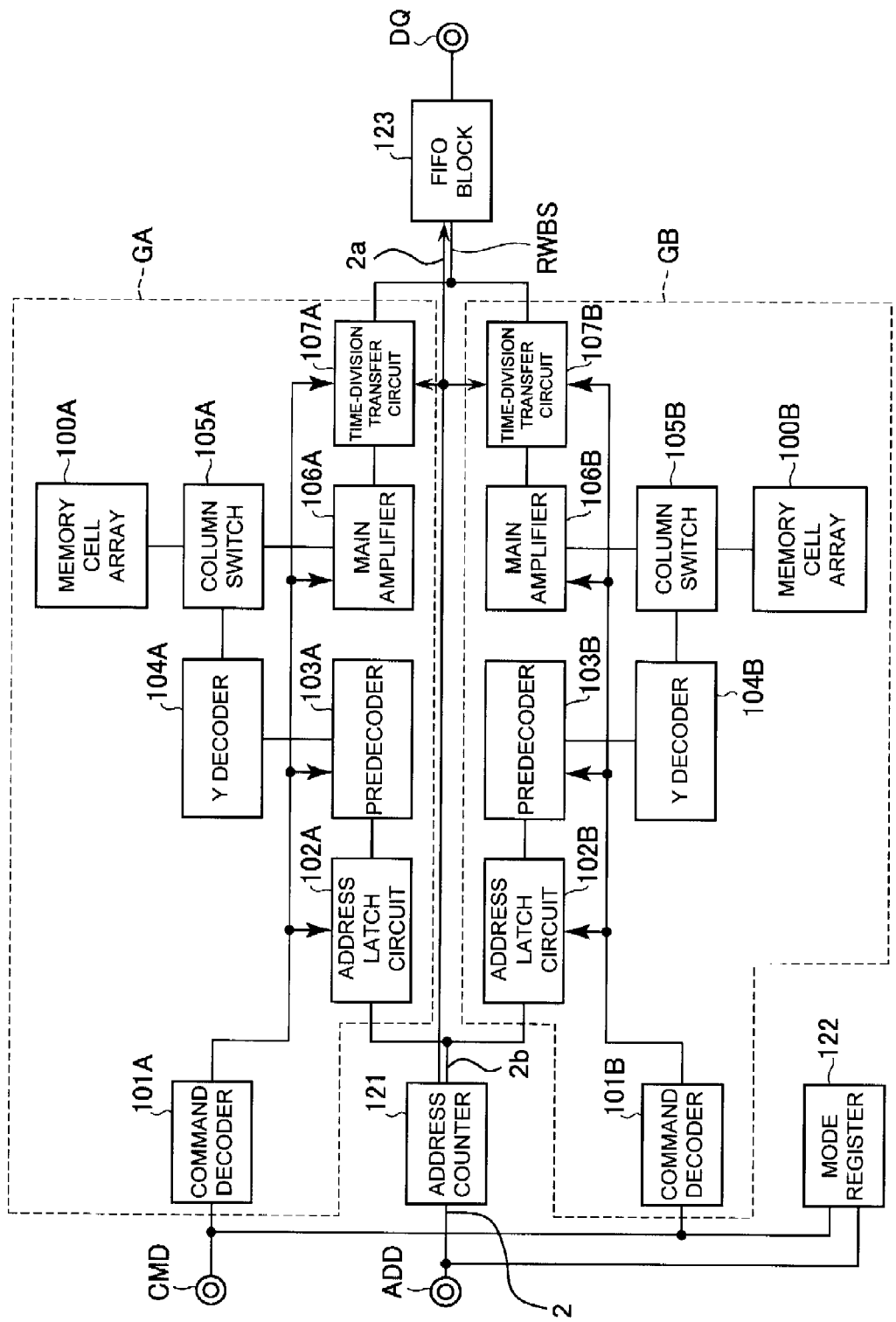
FIG. 5 is a block diagram showing a configuration of a main part of a semiconductor memory device according to a second embodiment of the present invention.

FIG. 5 is a block diagram showing a configuration of a main part of a semiconductor memory device according to the second embodiment of the present invention. In FIG. 5, only column system circuits and data system circuits, which are characteristic parts of the semiconductor memory device, are shown, and row system circuits or the like are omitted.

The semiconductor memory device is a DDR3 synchronous DRAM and a prefetch number is 8 bits. With respect to a burst length (BL), at least BL=4 and BL=8 are selectable. A minimum burst length is BL=4.

As shown in FIG. 5, in the semiconductor memory device, most of circuits are divided into two groups (group GA and group GB). However, an address counter 121, a mode register 122, and a FIFO block 123 are not grouped. These components are commonly arranged to the two groups.

Out of column addresses 2a and 2b, which are outputs of the address counter 121, the address signal 2a is supplied to a time-division transfer circuits 107A and 107B and the FIFO circuit group 123. The address signal 2b is supplied to address latch circuits 102A and 102B. In the second embodiment, the time-division transfer circuits 107A and 107B and the FIFO circuit group 123 correspond to the I/O circuit 50 shown in FIG. 1.

A column address which is output signal of the address counter 121 is commonly supplied to the groups GA and GB. Thus, one set of column address wirings can be sufficient. The column address is latched to one of the address latch circuits 102A and 102B by control of command decoders 101A and 101B. Thereby, the column address becomes effective to one of the groups GA and GB.

The column address supplied to the group GA is supplied to the address latch circuit 102A, a predecoder 103A, a Y decoder 104A to control a column switch 105A. The column switch 105A is supplied with data read from a memory cell array 100A, and the selected data is supplied to a main amplifier 106A by control of the Y decoder 104A. Output of the main amplifier 106A is supplied to the time-division transfer circuit 107A. The same is true of the group GB.

The reason for the grouping is to realize tCCD=2 in the DDR3 synchronous DRAM of which the prefetch number is 8 bits. A significance to realize tCCD=2 in the DDR3 synchronous DRAM is explained below.

In the DDR3 synchronous DRAM, 8-bit data is read at once from a DRAM core at a time of reading, the 8-bit data is temporarily held in a prefetch circuit, and thereafter, the data is burst-outputted to outside. On the contrary, at a time of writing, the 8-bit data burst-inputted from outside is temporarily held in the prefetch circuit, and thereafter, the 8-bit data is written into the DRAM core at once. To perform such operations, in the synchronous DRAM, the prefetch number is basically defined as a minimum burst length.

However, to realize a faster data transfer rate, it is inevitably necessary to increase the prefetch number. Thus, when the prefetch number is defined as the minimum burst length, it becomes difficult to be compatible with a conventional synchronous DRAM. Using an example of the DDR3 synchronous DRAM, when the minimum burst length is set to 8, an operation at a burst length=4 which is possible in a DDR2 synchronous DRAM cannot be performed. As a result, its compatibility is lost.

To solve such a problem, a "burst chop function" has been proposed. The burst chop function is to designate in advance so that a burst operation stops in a middle of the operation at a time of issuance of a read command or a write command. Accordingly, when an example in which the burst chop function is installed in the DDR3 synchronous DRAM is assumed, by the designation at a time of issuance of the read command or the write command, it becomes possible to use a burst length=8 as a burst length=4. Thereby, even when the prefetch number increases, it becomes possible to be compatible with the conventional product (DDR2).

However, the burst chop function is, after all, to stop the burst operation in the middle of the operation. Thus, an input cycle of the command cannot be shortened. That is, in the DDR3 synchronous DRAM of which the prefetch number is 8 bits, it is possible to receive the command by each 4 clock cycles (tCCD=4), while at a time of the burst chop, an input/output operation is completed in first-half 2 clock cycles, and last-half 2 clock cycles are a waiting time. That is, even when the burst length is shortened to 4 bits by using the burst chop function, it does not mean that the input cycle of the command is automatically shortened to 2 clock cycles (tCCD=2), and the input cycle of the command is still 4 clock cycles. Thus, this poses a problem in that, when the burst chop is performed, a data transfer efficiency is deteriorated.

As a method of solving such a problem, it can be considered to arrange two sets of command decoders or address counters and operate the both sets by shifting by 2 clock cycles. However, in this method, the number of column address wirings and data buses are doubled, and thus, a chip area increases greatly. For example, when a chip in which data inputted and outputted simultaneously is 16 bits (×16 product) is assumed, if the prefetch number is 8, the number of data buses is 128 (=16×8) in a normal chip while two sets of 128 data buses, i.e., as many as 256 data buses, are needed in the chip described above.

Further, in this method, when the burst length=8 is set, it is sufficient that only one of the circuits is operated. However, when the burst length=4 is set, it is necessary that the both circuits are operated. Thus, when the burst length=4 is set, a charge or discharge current of the data bus or the like is doubled as compared to a case of the burst length=8, which poses a problem of power consumption increase.

As described above, to achieve tCCD=2 in the DDR3 synchronous DRAM, there are various problems. The second embodiment is directed to solve such problems while achieving tCCD=2 in the DDR3 synchronous DRAM.

However, when tCCD is shortened, the number of column addresses to be accumulated in the address counter 121 increases. Specifically, when AL=10; CWL=8; BL=4; and tCCD=2, the accumulation number X=12 is established, and thus, as compared to a case that tCCD=4, the circuit scale of the address counter is almost doubled. Accordingly, in the second embodiment, there is particularly a substantial requirement for reducing the circuit scale of the address counter.

Also in the present embodiment, the address counter 121 has a circuit configuration shown in FIG. 2. Accordingly, when the number (=n) of bits of the address signal 2 is 16 bits, for example, 192 (=12×16) latch circuits are needed. Further, also the command counters 22 to 24 have a circuit configuration shown in FIG. 3, and are each configured by 12 (=m)

shift registers 29-1 to 29-*m*. As a result, a total of 228 (=192+ 12×3) latch circuits or shift registers are used.

Contrary thereto, when a case that a normal point-shift FIFO circuit without a plurality of output systems is used is assumed, if the number of bits of the address signal 2*a* is 5 bits and that of the address signal 2*b* is 16 bits, the number of latch circuits required is m×(16+5), and thus, 252 latch circuits are needed. Further, when 36 (=m×3) shift registers configuring the command counters 22 to 24 are added, a total of 288 (=252+36) latch circuit or shift register are needed. Accordingly, it is understood that when the present invention is applied, the circuit scale is reduced by about 20%.

Explanations of the semiconductor memory device according to the second embodiment will be continued below by focusing on a part related with the read operation.

Figure 6:
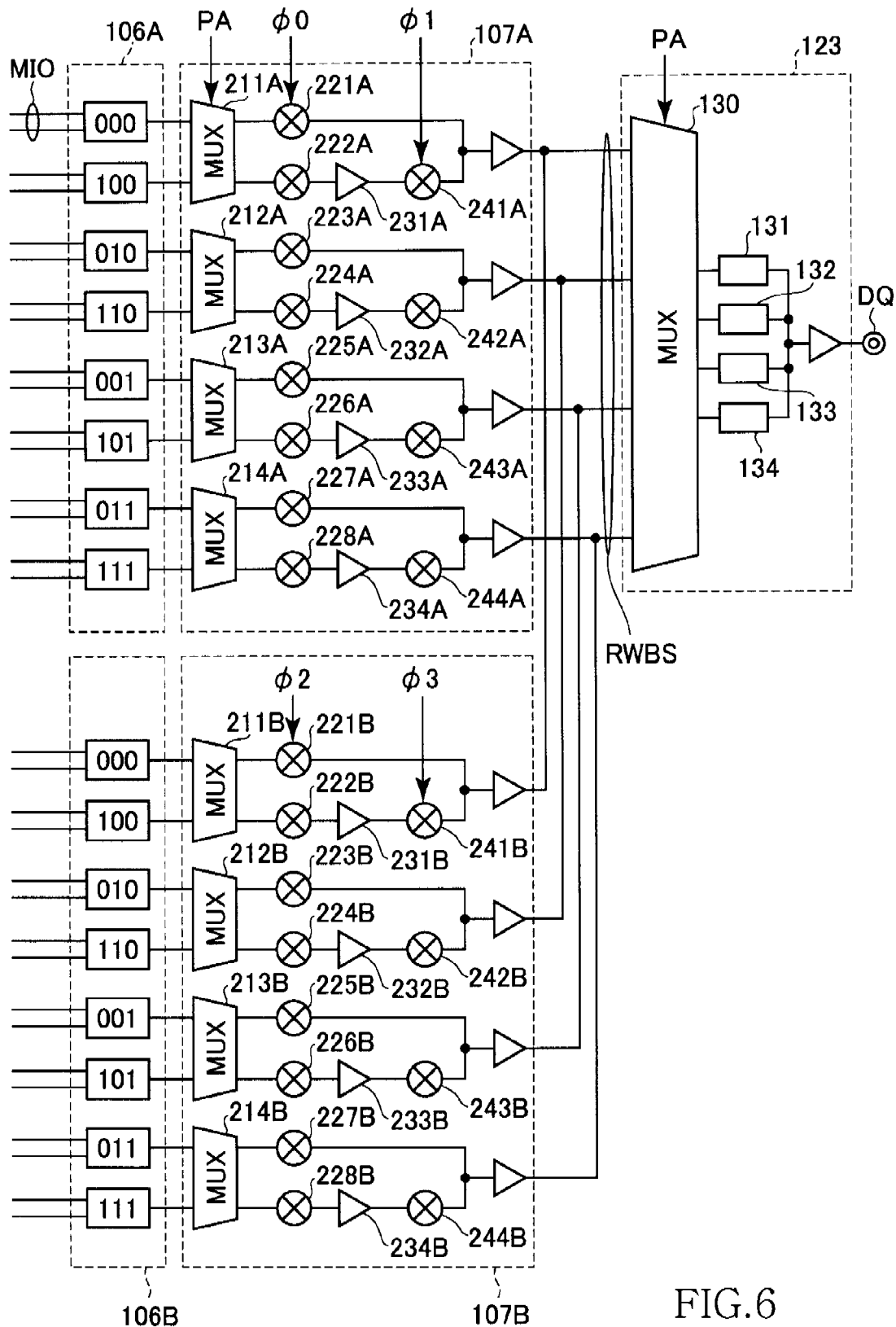
FIG. 6 is a circuit diagram showing in more detail a circuit from the main amplifiers to a data input/output terminal shown in FIG. 5.

FIG. 6 is a circuit diagram showing in more detail a circuit from the main amplifiers 106A and 106B to a data input/output terminal DQ. The circuit shown in FIG. 6 is a portion relating to one data input/output terminal DQ, and accordingly, the same circuits of a number that is equal to the number of bits simultaneously inputted and outputted are needed. For example, in a case of a chip in which data simultaneously inputted and outputted is 16 bits (×16 product) 16 circuits shown in FIG. 6 are needed.

As shown in FIG. 6, from the main amplifiers 106A and 106B, 8-bit data, which is the same number as a prefetch number, are outputted, respectively. In the column address of these data, high-order bits are common, and low-order 3 bits only are different. 3-bit values shown within the main amplifiers 106A and 106B indicate the low-order 3 bits of the column address. The main amplifiers 106A and 106B have a function for converting a complementary signal into a single signal.

Outputs of the main amplifiers 106A and 106B are supplied to the time-division transfer circuits 107A and 107B, respectively. The time-division transfer circuit 107A includes four multiplexers 211A to 214A, eight switches 221A to 228A, four buffers 231A to 234A, and four switches 241A to 244A. The time-division transfer circuit 107B has the same circuit configuration.

The multiplexers 211A to 214A are circuits that switch an association relationship between 2-bit data supplied from the main amplifier 106A and the switches 221A to 228A. The switching is controlled by a prefetch address PA. For example, in the case of the multiplexer 211A, data of which low-order 3-bits are "000" is outputted to the switch 221A or the switch 222A, and data of which low-order 3-bits are "100" is outputted to the switch 222A or the switch 221A. The same is true of the multiplexers 211B to 214B included in the time-division transfer circuit 107B.

As shown in FIG. 6, while outputs of the switches 221A, 223A, 225A, and 227A are directly supplied to a data bus RWBS, outputs of the switches 222A, 224A, 226A, and 228A are supplied via the switches 231A to 234A and 241A to 244A, respectively, to the data bus RWBS. The switches 221A to 228A are circuits rendered conducting in response to a control signal φ0, and the switches 241A to 244A are circuits rendered conducting in response to a control signal φ1. Accordingly, based on timings of the control signals φ0 and φ1, it is possible to supply the 8-bit data supplied from the main amplifier 106A to the data bus RWBS in a time-division manner by each 4 bits. The above-described configuration and operation are true of those in the time-division transfer circuit 107B.

The data bus RWBS is arranged commonly to the time-division transfer circuits 107A and 107B. Thus, the number of the data buses RWBS is 4. Accordingly, in a case of the ×16 product, the number of the data buses RWBS is 64 (=4×16).

Thus, the number is reduced as compared to a conventional case. Since a semiconductor memory device of a type in which a burst chop is performed needs 128 (=8×16) data buses RWBS, the number is reduced to half. Further, a semiconductor memory device of a type in which two sets of command decoders or address counters are simply arranged needs 256 (=8×16×2) data buses RWBS, as described above. Thus, the number is reduced to ¼.

As shown in FIG. 6, the data buses RWBS are connected to the FIFO block 123. The FIFO block 123 includes a multiplexer 130 and four FIFO circuits 131 to 134. The multiplexer 130 is a circuit that switches an association relationship between the 4-bit data supplied via the data bus RWBS and the FIFO circuits 131 to 134. The switching is controlled by the prefetch address PA.

The FIFO circuits 131 to 134 can each hold read data of (CL+BL/2)/2, where CL is a CAS latency. Accordingly, when BL=8 is established, at least 2-bit read data can be held. Thereby, the FIFO circuits 131 to 134 become capable of holding 8-bit read data which is the same as the prefetch number. At the time of outputting data, the read data stored in the FIFO circuits 131 to 134 are outputted in this order in synchronization with an external clock signal (CK).

Figure 7:
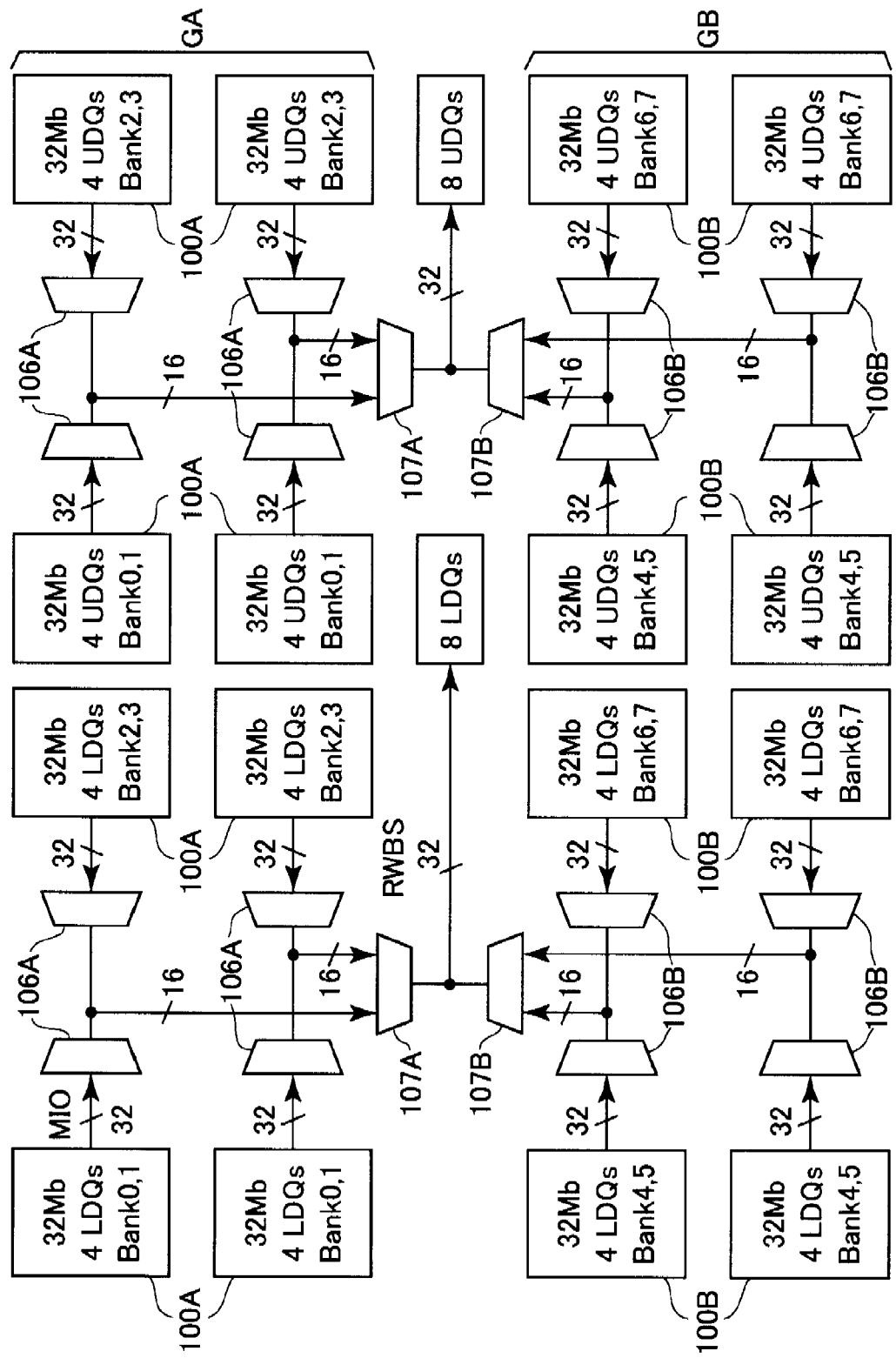
FIG. 7 is a schematic layout chart of the semiconductor memory device according to the second embodiment.

FIG. 7 is a schematic layout chart of the semiconductor memory device according to the present embodiment. This example shows a 512M-bit memory of which prefetch number is 8 bits and input/output bit number is 16 bits (×16 product)

As shown in FIG. 7, in this example, the memory cell array is divided into 8 banks (a bank 0 to a bank 7), and out of these banks, the banks 0 to 3 belong to the group GA and the banks 4 to 7 belong to the group GB. Each of the banks 0 to 7 is divided into four memory mats, and 16-bit data simultaneously inputted and outputted are allotted to the four memory mats by each 4 bits. In the semiconductor memory device, the prefetch number is 8 bits, and thus, 32-bit (=4×8) data is simultaneously inputted and outputted to/from each memory mat.

Subsequently, an operation of the semiconductor memory device is described.

Figure 8:
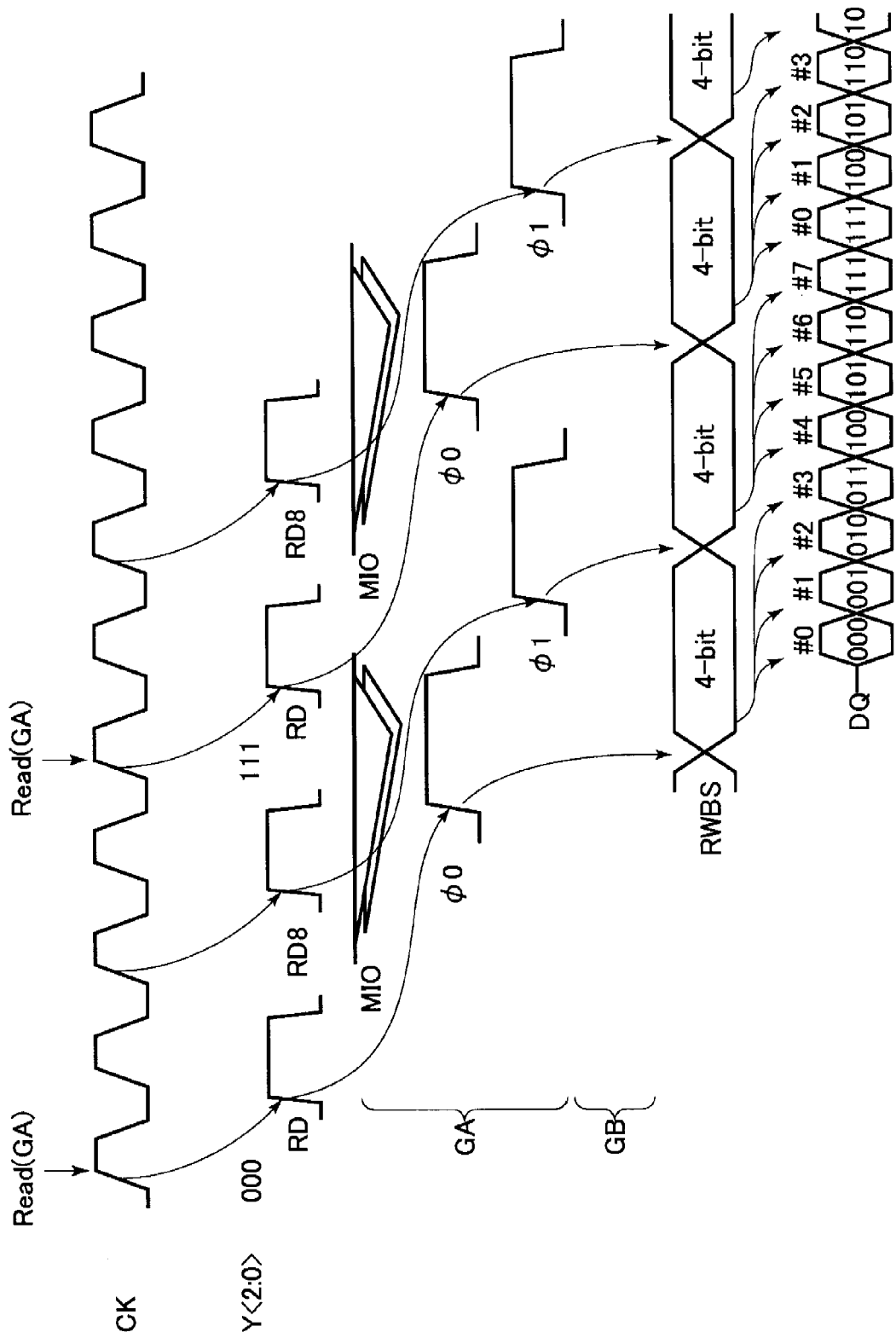
FIG. 8 is a timing chart showing an operation when the burst length is set to 8 bits (BL=8)

FIG. 8 is a timing chart showing an operation when the burst length is set to 8 bits (BL=8). Setting of the burst length is performed by issuing a command of a mode register set, and thereafter, setting to the mode register 122 shown in FIG. 5 a mode signal indicating the burst length.

As shown in FIG. 8, when BL=8 is set, the input cycle of the command (a read command, in the example shown in FIG. 8) is 4 clock cycles. That is, it is possible to receive the command by each 4 clock cycles (tCCD=4).

Firstly, when a first read command is issued, the command decoder 101A generates an internal command RD, and in response thereto, a read operation is begun within the group GA. When BL=8 is set, the command decoder 101A generates the internal command RD, and thereafter, generates an internal command RD8 with a delay of 2 clock cycles.

Data of 8 bits per DQ read in response to the internal command RD is amplified by the main amplifier 106A, and supplied to the time-division transfer circuit 107A. Thereafter, the control signal φ0 that responds to the internal command RD is rendered active, and further, the control signal φ1 that responds to the internal command RD8 is rendered active with a delay of 2 clock cycles. When the control signal φ0 is rendered active, 4 bits, out of read 8 bits, are supplied to the data bus RWBS, and these 4-bit data are transferred to the FIFO block 123.

These 4-bit read data are respectively stored in the FIFO circuits 131 to 134, and are burst-outputted in synchronization with the external clock signal CK. While such burst output is being performed, the control signal φ1 is rendered active this time, and the remaining 4 bits are supplied to the data bus RWBS. Thereafter, subsequent to the burst output of the first-half 4 bits, the last-half 4 bits are burst-outputted. Thereby, BL=8 is achieved.

Subsequently, when a second read command is issued with a delay of 4 clock cycles from the issuing of the first read command, the operation similar to that described above is performed.

In the example shown in FIG. 8, a case where a burst type is a sequential mode is shown. The low-order 3 bits of the column address that corresponds to the first read command is "000", and the low-order 3 bits of the column address that corresponds to the second read command is "111". Thereby, in the burst output that corresponds to the first read command, data having the column address of which low-order 3 bits are "000" is firstly outputted, and in the burst output that corresponds to the second read command, data having the column address of which low-order 3 bits are "111" is firstly outputted. Such control can be possible by controlling the multiplexers 211A to 214A, 211B to 214B, and 130, based on the prefetch address PA shown in FIG. 6.

Thus, when BL=8 is set, only one of the groups GA and GB is operated, and the other group is not operated. The data transfer using the data bus RWBS is performed in units of 4 bits. Thus, an operation frequency of the data bus RWBS is doubled as compared to the conventional case. However, due to the decrease in number of data buses RWBS, it becomes possible to arrange a shield wiring between the adjacent data buses. Thus, nearly no signal quality deterioration is caused due to the doubled operation frequency.

That is, when the shield wirings are interposed, respectively, among 64 data buses RWBS, the number of wirings is 128, similar to the conventional case where the burst chop is performed. However, the shield wiring can be not a signal line but a power supply wiring, for example. Thus, it is possible to use a wiring thinner than the data bus RWBS. As a result, it becomes possible to make a wiring width of the data bus RWBS thick.

More specifically, while L/S (line and space) of the data bus RWBS in the conventional case where the burst chop is performed is 1.0/1.0 μm, the L/S of the data bus RWBS can be expanded to 1.2/1.2 μm in the semiconductor memory device according to the embodiment. As a result, a signal delay is not only decreased, but coupling noise between the adjacent wirings can also be decreased. Thus, there is nearly no signal quality deterioration caused due to the increase in operation frequency.

Figure 9:
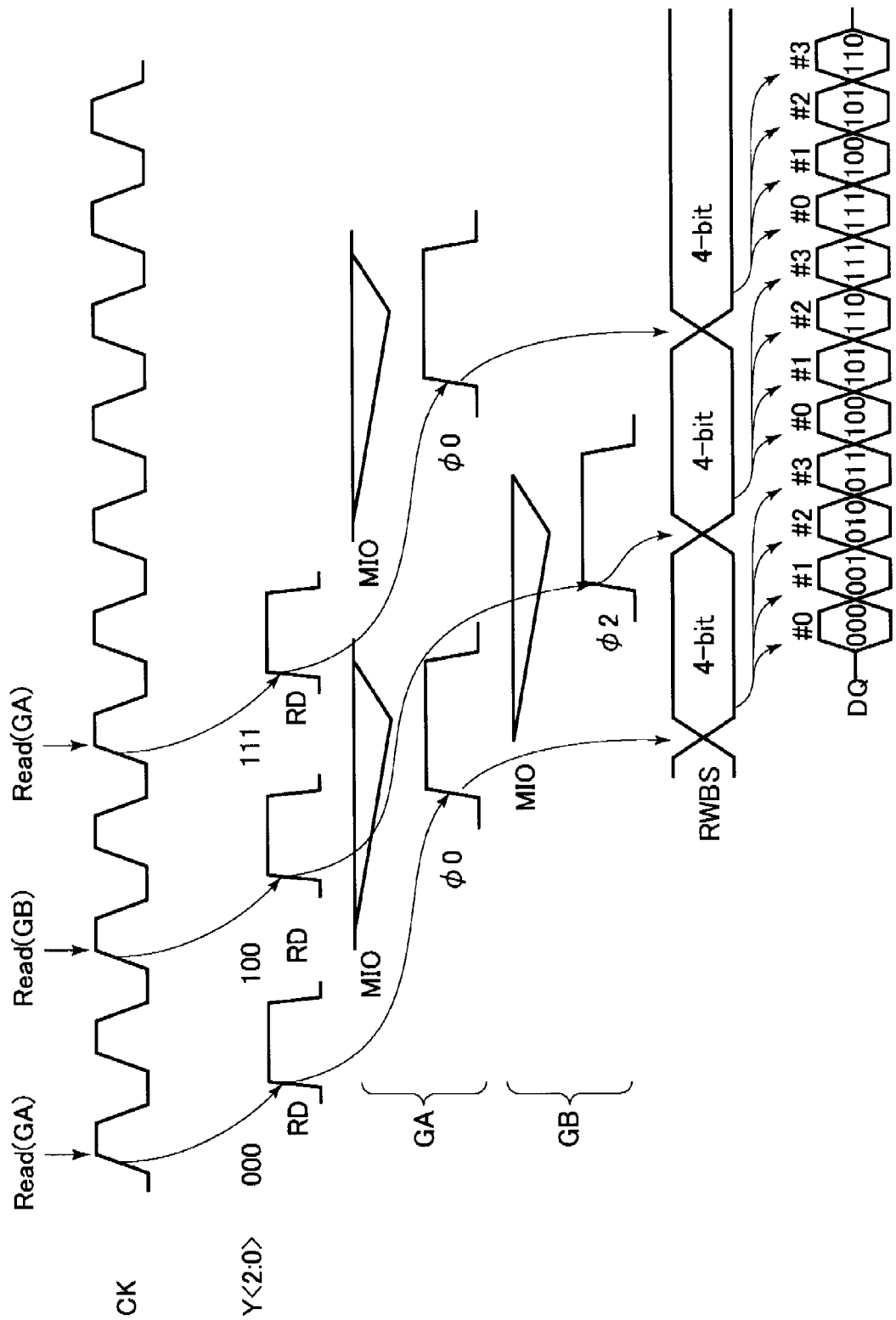
FIG. 9 is a timing chart showing an operation when the burst length is set to 4 bits (BL=4)

FIG. 9 is a timing chart showing an operation when the burst length is set to 4 bits (BL=4).

As shown in FIG. 9, when BL=4 is set, the input cycle of the command (the read command, in the example shown in FIG. 9) is 2 clock cycles. That is, it is possible to receive the command by each 2 clock cycles (tCCD=2).

Firstly, when the first read command is issued, the command decoder 101A generates the internal command RD, and in response thereto, the read operation is performed within the group GA. When BL=4 is set, the internal command RD8 is not generated.

The data of 8 bits per DQ read in response to the internal command RD is amplified by the main amplifier 106A, and supplied to the time-division transfer circuit 107A. Thereafter, when the control signal φ0 is rendered active in response to the internal command RD, 4 bits, out of read 8 bits, are supplied to the data bus RWBS, and the 4-bit data are transferred to the FIFO block 123. On the other hand, when BL=4 is set, the control signal φ1 is not rendered active, and thus, the remaining 4 bits are not supplied to the data bus RWBS.

Subsequently, when the second read command is issued with a delay of 2 clock cycles from the issuing of the first read command, the command decoder 101B generates the internal command RD this time, and in response thereto, the read operation is performed within the group GB. The data of 8 bits per DQ thereby read is amplified by the main amplifier 106B, and is supplied to the time-division transfer circuit 107B. Thereafter, when the control signal φ2 is rendered active in response to the internal command RD, 4 bits, out of read 8 bits, are supplied to the data bus RWBS, and the 4-bit data are transferred to the FIFO block 123. Again, a control signal φ3 is not rendered active, and thus, the remaining 4 bits are not supplied to the data bus RWBS.

Subsequently in a similar manner, the groups GA and GB are alternately operated. Thus, BL=4 can be achieved. In this manner, in the semiconductor memory device according to the embodiment, in the operation at BL=4, the data transfer using the data bus RWBS is also performed in units of 4 bits.

In the example shown in FIG. 9, a case where the burst type is a sequential mode is shown. The low-order 3 bits of the column address corresponding to the first read command is "000", the low-order 3 bits of the column address corresponding to the second read command is "100", and the low-order 3 bits of the column address corresponding to the third read command is "111". Thus, in the burst output corresponding to the first read command, the data having the column address of which low-order 3 bits are "000" is firstly outputted, and the data of which low-order 3 bits are "100" to "111" are not outputted. Likewise, in the burst output corresponding to the second or third read command, the data having the column address of which low-order 3 bits are "100" or "111" is firstly outputted, and the data of which low-order 3 bits are "000" to "011" are not outputted.

As described above, in the semiconductor memory device according to the embodiment, the data transfer using the data bus RWBS is performed in units of 4 bits, which is the minimum burst length, irrespective of the burst length. Thus, a need of performing the burst chop can be eliminated. Further, the data transfer cycle using the data bus is constant irrespective of the input cycle of the command. Thus, it becomes possible to inhibit an increase in circuit scale or an increase in power consumption.

According to the present invention, the data transfer using the data bus is performed in units of m bits, which is the minimum burst length, irrespective of the burst length set to the mode register. Thus, it becomes possible to set the burst length smaller than a prefetch number without performing a burst chop. Further, a data transfer cycle using the data bus is constant irrespective of an input cycle of the command. Thus, it becomes possible to inhibit an increase in circuit scale or an increase in power consumption.

The present invention can preferably apply to the semiconductor memory device, especially a DRAM.

Figure 10:
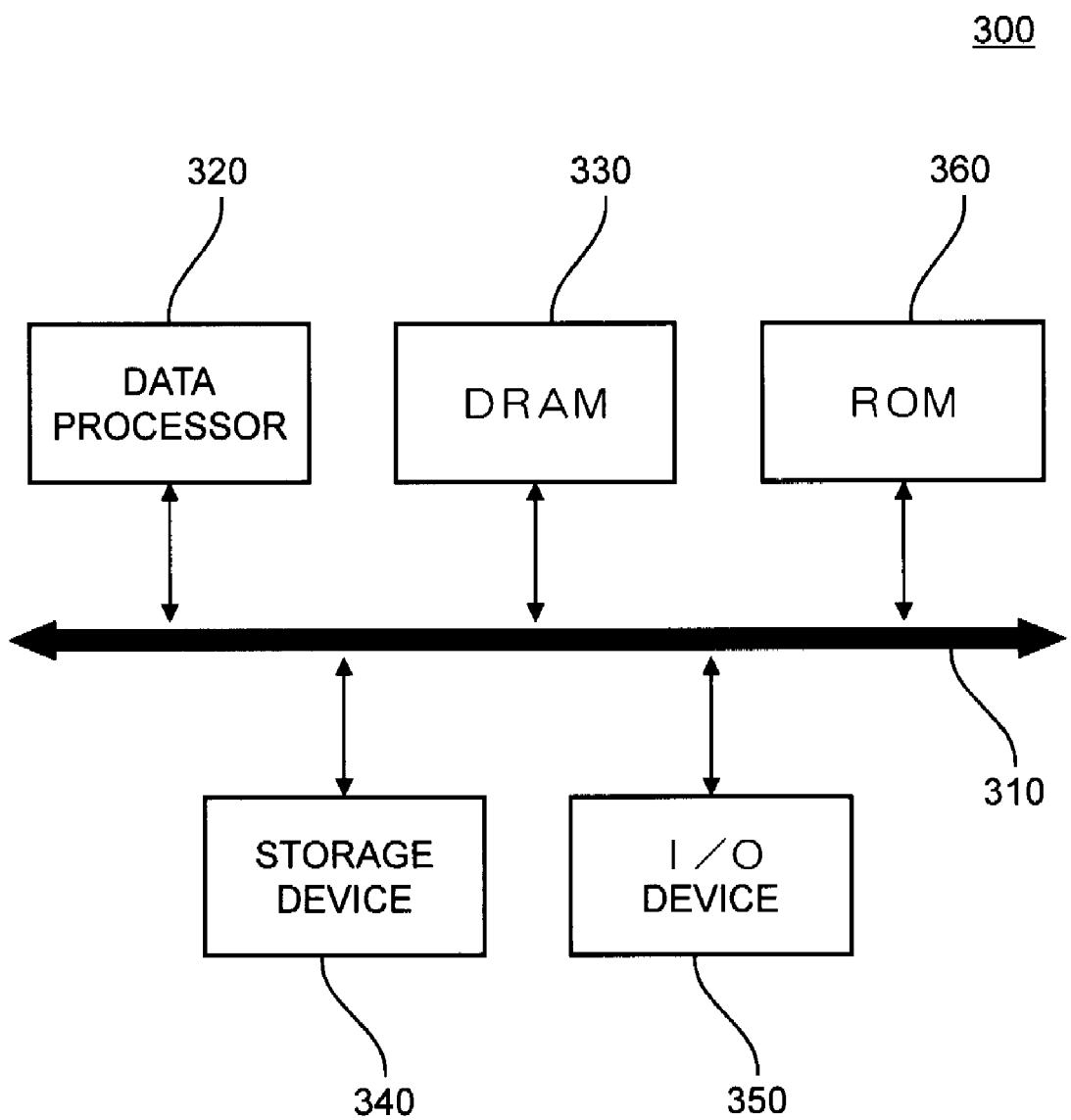
FIG. 10 is a block diagram showing a data processing system using the DRAM that the present invention is applied.

FIG. 10 is a block diagram showing a data processing system 300 using the DRAM that the present invention is applied.

The data processing system 300 shown in FIG. 10 includes a data processor 320 and a DRAM 330 that the present invention is applied are connected to each other via a system bus 310. The data processor 320 can be selected from at least a microprocessor (MPU) and a digital signal processor (DSP).

In FIG. 10, although the data processor 320 and the DRAM 330 are connected via the system bus 310 in order to simplify the diagram, they can be connected via not the system bus 310 but a local bus.

Further, in FIG. 10, although only one set of system bus 310 is employed in the data processing system 300 in order to simplify the diagram, a serial bus or a parallel bus connected to the system bus 310 via connectors can be provided. As shown in FIG. 10, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device 350 can consists of either input or output device. Further, although each one element is provided as shown in FIG. 10, two or more same elements can be provided in the data processing system.

The present invention is in no way limited to the aforementioned embodiments, but rather various modifications are possible within the scope of the invention as recited in the claims, and naturally these modifications are included within the scope of the invention.

For example, the first and second operation modes are provided in the above embodiments. In the first operation mode, the FIFO units are collectively used, and in the second operation mode, the FIFO units are divided in two and used. However, the present invention is not limited thereto, and operation modes in which FIFO units are divided in three and used can be provided.

Further, while the command counters 22 and 23 have a ring counter configuration in the above embodiments, the present invention is not limited thereto. However, when the ring counter configuration is adopted, it becomes possible to change the count value at a higher speed as compared to a case that a binary counter configuration or the like is used.

What is claimed is:

1. An address counter comprising:
a plurality of FIFO units each of which stores a corresponding bit of an address signal, each FIFO unit including a plurality of parallel connected latch circuits each having an input gate and first and second output gates;
a first command counter that brings any one of the input gates included in each FIFO unit into ON state in response to a first internal command;
a second command counter that brings any one of the first output gates included in each FIFO unit into ON state in response to a second internal command; and
a third command counter that brings any one of the second output gates included in each FIFO unit into ON state in response to a third internal command.

2. The address counter as claimed in claim 1, wherein each of the first to third command counters has a ring counter configuration in which shift registers are connected in circulation.

3. The address counter as claimed in claim 2, wherein a number of latch circuits included in the FIFO units and a number of the shift registers each configuring the first to third command counters are equal to each other.

4. The address counter as claimed in claim 1, wherein
the first internal command is generated in response to issuance of at least a read command or a write command,
the second internal command is generated after a lapse of a first latency relative to the first internal command, and
the third internal command is generated after a lapse of a second latency relative to the first internal command.

5. A semiconductor memory device, comprising:
a memory cell array;
a data input/output terminal;
a first data selection circuit that supplies a first data bus with write data inputted via the data input/output terminal;
a second data selection circuit that supplies the memory cell array with the write data on the first data bus; and
the address counter including:
a plurality of FIFO units each of which stores a corresponding bit of an address signal, each FIFO unit including a plurality of parallel connected latch circuits each having an input gate and first and second output gates;
a first command counter that brings any one of the input gates included in each FIFO unit into ON state in response to a first internal command;
a second command counter that brings any one of the first output gates included in each FIFO unit into ON state in response to a second internal command; and
a third command counter that brings any one of the second output gates included in each FIFO unit into ON state in response to a third internal command,
wherein the address signal that passes through the first output gate is supplied to the first data selection circuit, and the address signal that passes through the second output gate is supplied to the second data selection circuit.

6. The semiconductor memory device as claimed in claim 5 further comprising a mode register for setting a burst length, wherein the first data selection circuit includes:
a FIFO block connected to the data input/output terminal;
a transfer circuit that inputs and outputs in parallel k-bit data continuously inputted or continuously outputted via the data input/output terminal; and
a second data bus that performs data transfer between the transfer circuit and the FIFO block, wherein
when a minimum burst length settable to the mode register is represented by j (<k), the transfer circuit performs data transfer using the second data bus in a j-bit unit irrespective of the burst length.

7. The semiconductor memory device as claimed in claim 6, wherein the memory cell array is divided into a plurality of groups, and
the semiconductor memory device further comprises main amplifiers each of which outputs the k-bit data from a corresponding group of the memory cell array, and wherein
the transfer circuit selects j-bit data for each group out of the k-bit data outputted from the main amplifiers and supplies the selected j-bit data via the second data bus to the FIFO block.

8. The semiconductor memory device as claimed in claim 7, wherein when the burst length set to the mode register is k, the transfer circuit successively supplies via the second data bus to the FIFO block the k-bit data read from the memory cell array belonging to a same group by each j bits.

9. The semiconductor memory device as claimed in claim 7, wherein when the burst length set to the mode register is j, the transfer circuit successively supplies via the second data bus to the FIFO block the j-bit data read from the memory cell array belonging to a different group.

10. A data processing system comprising a data processor and a semiconductor memory device coupled to the data processor, wherein the semiconductor memory device includes:
- a memory cell array;
- a data input/output terminal;
- a first data selection circuit that supplies a first data bus with write data inputted via the data input/output terminal;
- a second data selection circuit that supplies the memory cell array with the write data on the first data bus; and
- the address counter including:
  - a plurality of FIFO units each of which stores a corresponding bit of an address signal, each FIFO unit including a plurality of parallel connected latch circuits each having an input gate and first and second output gates;
  - a first command counter that brings any one of the input gates included in each FIFO unit into ON state in response to a first internal command;
  - a second command counter that brings any one of the first output gates included in each FIFO unit into ON state in response to a second internal command; and
  - a third command counter that brings any one of the second output gates included in each FIFO unit into ON state in response to a third internal command, wherein the address signal that passes through the first output gate is supplied to the first data selection circuit, and the address signal that passes through the second output gate is supplied to the second data selection circuit.

* * * * *